(12) United States Patent
Roset et al.

(10) Patent No.: US 8,659,742 B2
(45) Date of Patent: Feb. 25, 2014

(54) LITHOGRAPHIC APPARATUS AND A DEVICE MANUFACTURING METHOD

(75) Inventors: Niek Jacobus Johannes Roset, Eindhoven (NL); Nicolaas Ten Kate, Almkerk (NL); Raymond Wilhelmus Louis Lafarre, Helmond (NL); Alexander Nikolov Zdravkov, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 415 days.

(21) Appl. No.: 12/969,635

(22) Filed: Dec. 16, 2010

(65) Prior Publication Data

US 2011/0149257 A1  Jun. 23, 2011

Related U.S. Application Data

(60) Provisional application No. 61/288,168, filed on Dec. 18, 2009, provisional application No. 61/311,618, filed on Mar. 8, 2010.

(51) Int. Cl.
*G03B 27/52* (2006.01)
*G03B 27/42* (2006.01)

(52) U.S. Cl.
USPC .............................................. 355/30; 355/53

(58) Field of Classification Search
USPC ................................. 355/30, 53, 72
See application file for complete search history.

(56) References Cited

U.S. PATENT DOCUMENTS

| | | | |
|---|---|---|---|
| 4,509,852 A | 4/1985 | Tabarelli et al. | |
| 7,000,622 B2 | 2/2006 | Woods et al. | |
| 7,192,488 B2 | 3/2007 | Woods et al. | |
| 7,460,206 B2 * | 12/2008 | Weissenrieder et al. | 355/30 |
| 7,532,309 B2 * | 5/2009 | Poon et al. | 355/67 |
| 7,749,689 B2 | 7/2010 | Hemker et al. | |
| 7,961,293 B2 * | 6/2011 | Streefkerk et al. | 355/53 |
| 2004/0136494 A1 | 7/2004 | Lof et al. | |
| 2004/0207824 A1 | 10/2004 | Lof et al. | |
| 2005/0248741 A1 * | 11/2005 | Kawamura et al. | 355/53 |
| 2006/0038968 A1 | 2/2006 | Kemper et al. | |
| 2006/0139614 A1 | 6/2006 | Owa et al. | |
| 2008/0187872 A1 | 8/2008 | Tsukamoto et al. | |
| 2008/0284993 A1 | 11/2008 | Shneyder et al. | |
| 2009/0091716 A1 | 4/2009 | Kadijk et al. | |

(Continued)

FOREIGN PATENT DOCUMENTS

| | | |
|---|---|---|
| EP | 1 420 300 | 5/2004 |
| EP | 1 429 188 | 6/2004 |

(Continued)

OTHER PUBLICATIONS

Japanese Office Action mailed May 29, 2012 in corresponding Japanese Patent Application No. 2010-276686.

*Primary Examiner* — Hung Henry Nguyen
(74) *Attorney, Agent, or Firm* — Pillsbury Winthrop Shaw Pittman LLP

(57) ABSTRACT

An immersion lithographic apparatus is disclosed that has a fluid handling system configured to provide immersion liquid between a final element of a projection system and a surface which includes, in cross-section, a feature, and has an adjustment fluid source configured to locally change the composition of the immersion liquid to cause a local decrease in surface tension of the immersion liquid at least when a meniscus of the immersion liquid contacts the feature.

20 Claims, 6 Drawing Sheets

(56) References Cited

U.S. PATENT DOCUMENTS

| | | |
|---|---|---|
| 2009/0296065 A1 | 12/2009 | Cloin et al. |
| 2009/0296068 A1 | 12/2009 | Castleijns et al. |
| 2010/0157265 A1 | 6/2010 | Ten Kate |
| 2011/0149257 A1 | 6/2011 | Roset et al. |

FOREIGN PATENT DOCUMENTS

| | | |
|---|---|---|
| EP | 1 636 654 | 3/2006 |
| JP | 2005-268747 | 9/2005 |
| JP | 2006-019742 | 1/2006 |
| JP | 2007-287824 | 11/2007 |
| JP | 2008-227452 | 9/2008 |
| JP | 2009-088509 | 4/2009 |
| JP | 2009-152593 | 7/2009 |
| JP | 2009-290212 | 12/2009 |
| WO | 99/49504 | 9/1999 |
| WO | 2004/032160 | 4/2004 |
| WO | 2008/001871 | 1/2008 |
| WO | 2009/116625 | 9/2009 |

* cited by examiner

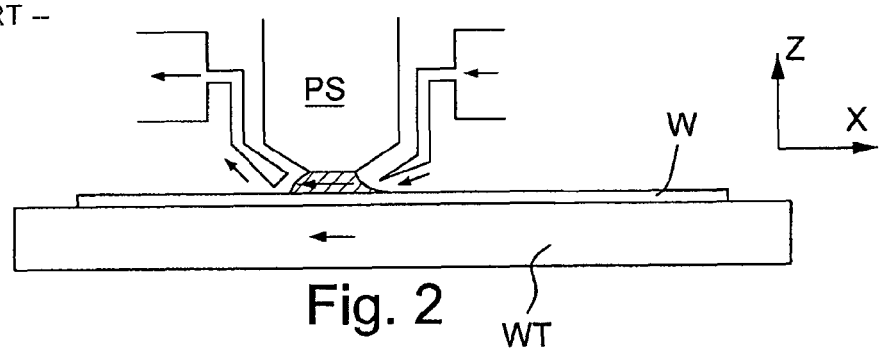
Fig. 2 -- PRIOR ART --
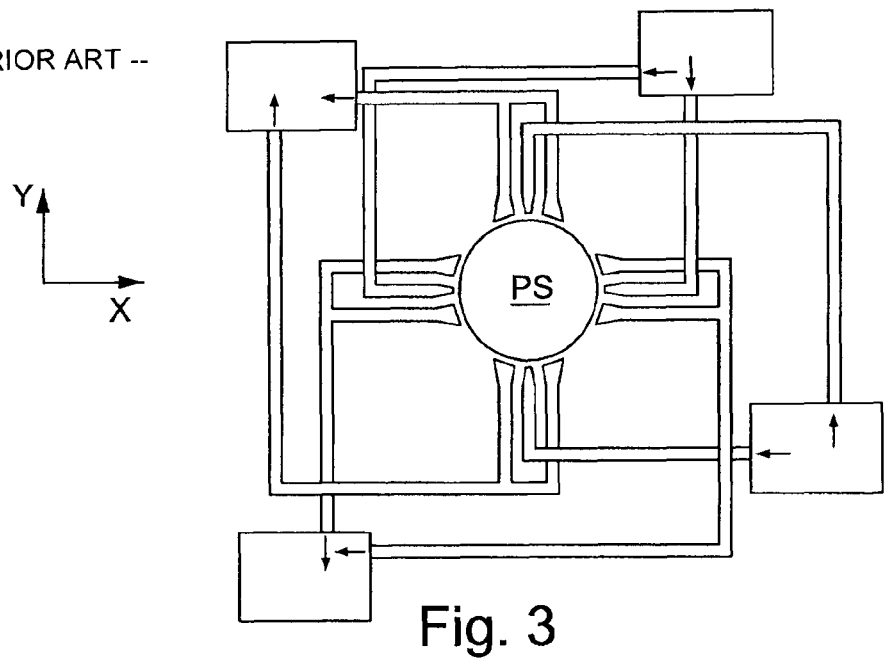
Fig. 3 -- PRIOR ART --
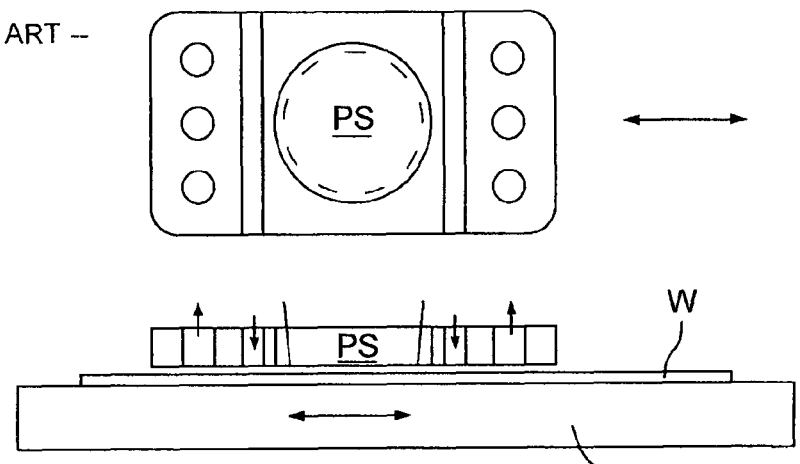
Fig. 4 -- PRIOR ART --

-- PRIOR ART --

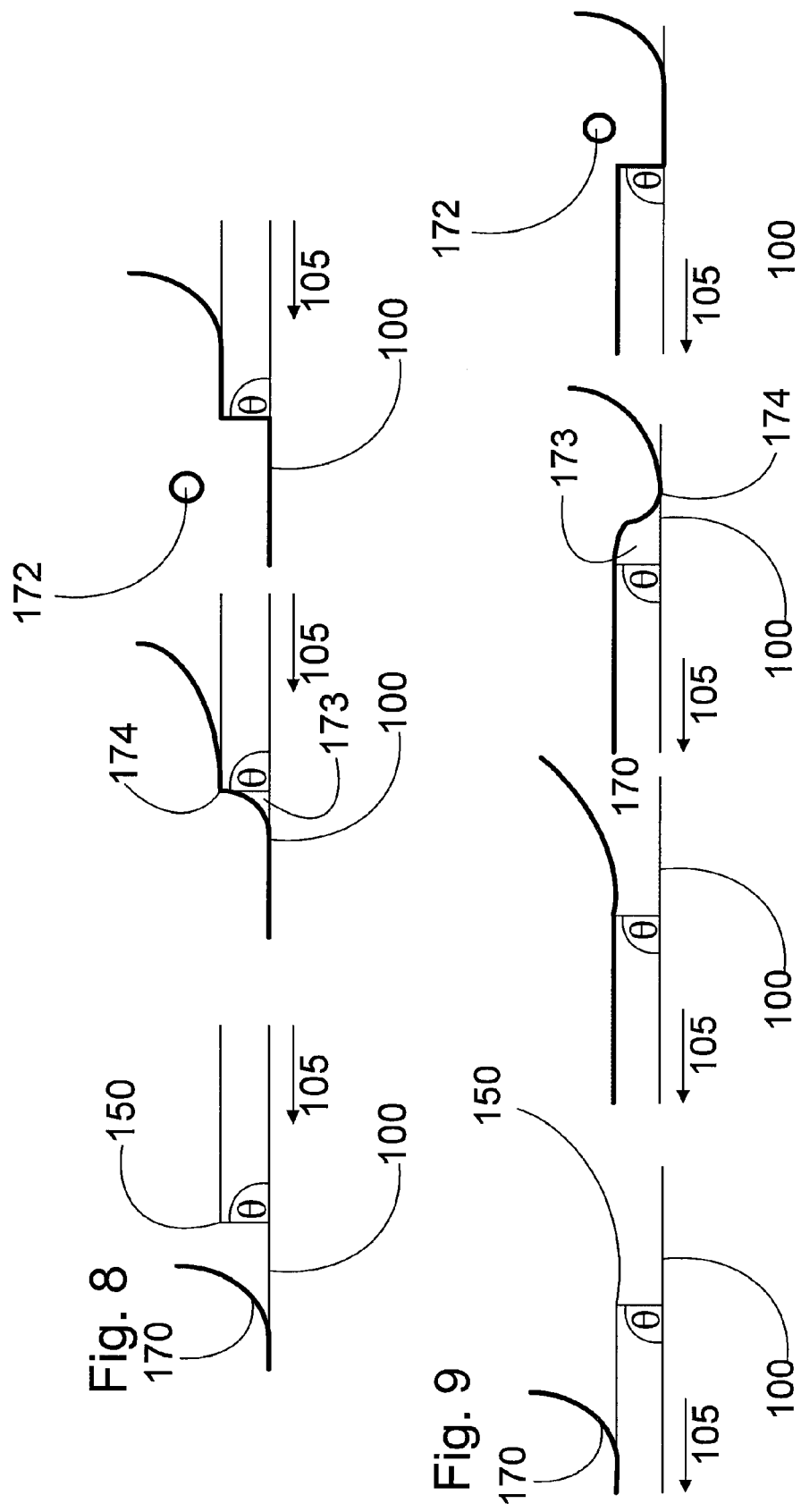

LITHOGRAPHIC APPARATUS AND A DEVICE MANUFACTURING METHOD

This application claims priority and benefit under 35 U.S.C. §119(e) to U.S. Provisional Patent Application Ser. No. 61/288,168, entitled "A Lithographic Apparatus and A Device Manufacturing Method", filed on Dec. 18, 2009, and to U.S. Provisional Patent Application Ser. No. 61/311,618, entitled "A Lithographic Apparatus and A Device Manufacturing Method", filed on Mar. 8, 2010. The contents of those applications are incorporated herein in their entirety by reference.

FIELD

The present invention relates to a lithographic apparatus, a support table and a method for manufacturing a device using a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In, an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

SUMMARY

If the immersion liquid is confined by a fluid handling system to a localized area on the surface which is under the projection system, a meniscus extends between the fluid handling system and the surface. If the meniscus passes over a feature on the surface, this can result in the meniscus temporarily being pinned to the feature. This can lead to loss of immersion liquid, e.g. as a droplet or a film (hereinafter reference to a droplet includes a film) from the meniscus, or inclusion of a bubble in the immersion liquid. Either situation is undesirable. An escaped droplet situation can lead to evaporational cooling of the surface on which the droplet is situated. Thereby temporary or permanent deformation of the surface may be caused or a drying stain may be left behind. An included bubble may interfere with the projection beam which can lead to imaging errors.

It is desirable, for example, to provide a lithographic apparatus in which the likelihood of leaking of a droplet from or the inclusion of a bubble into the immersion space is reduced.

According to an aspect, there is provided an immersion lithographic apparatus comprising: a fluid handling system configured to provide immersion liquid between a final element of a projection system and a surface which comprises, in cross-section, a feature; and an adjustment fluid source configured locally to change the composition of the immersion liquid to cause a local decrease in surface tension of the immersion liquid at least when a meniscus of the immersion liquid contacts the feature.

According to an aspect, there is provided a device manufacturing method, comprising: projecting a patterned beam of radiation through an immersion liquid confined to a space between the final element of a projection system and the substrate by a fluid handling system; moving a surface comprising, in cross-section, a feature; and locally changing the composition of immersion liquid as a meniscus of immersion liquid moves over the feature.

According to an aspect, there is provided a support table having a surface comprising in cross-section a feature, the support table comprising a surface tension adjustment fluid source configured to supply fluid, the surface tension adjustment fluid source being in fluid communication with the surface so that when an immersion liquid meniscus moves over the feature the surface tension adjustment fluid from the source changes the composition of the immersion liquid locally to the feature causing a local decrease in surface tension of the meniscus.

According to an aspect, there is provided an immersion lithographic apparatus comprising: a fluid handling structure configured to supply immersion liquid to a space between a final element of a projection system and a surface of a body which moves relative to the projection system, the surface comprising a feature; and a surface tension adjustment fluid source configured to change the composition of immersion liquid locally to the feature by adjusting the surface tension of a liquid meniscus between the fluid handling structure and the surface as the meniscus moves relatively across the surface.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts a further liquid supply system for use in a lithographic projection apparatus;

FIGS. 6 to 10 depict, in cross-section, various geometries of a meniscus of liquid running over an edge of a surface;

FIG. 10 depicts, in cross-section, a member on a surface;

DETAILED DESCRIPTION

Figure 1:
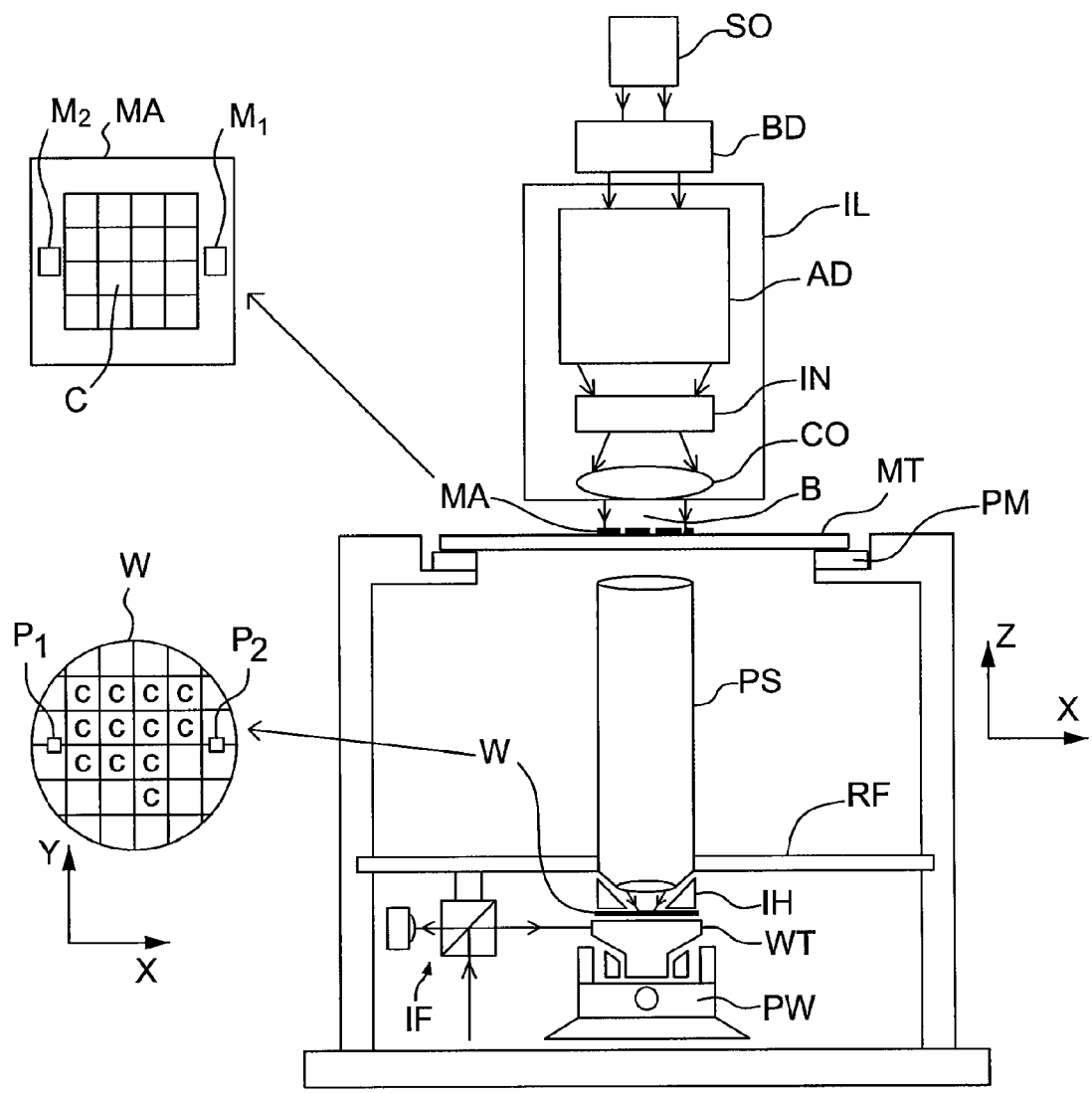
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a table (e.g. a substrate or wafer table) WT constructed to support an object, for example as a substrate table it is constructed to hold a substrate (e.g. a resist-coated wafer) W, and connected to a second positioner PW configured to accurately position the object in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held, in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more support tables, such as a substrate table WT (and/or two or more patterning device tables). In such "multiple stage" machines the additional tables may be used in parallel, or preparatory steps may be carried out on one or more tables while one or more other tables are being used for exposure. In an embodiment, at least one support table is a substrate table and another table supports one or more other objects, such as a sensor. In an embodiment, measurements of the projection beam may be made while the substrate is exchanged for a further substrate for exposure.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in, the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film Magnetic heads, etc.

Arrangements for providing liquid between a final element of the projection system and the substrate can be classed into at least two general categories. These are the bath type arrangement and the so called localized immersion system. In the bath type arrangement substantially the whole of the substrate and optionally part of the substrate table is submersed in a bath of liquid. The so called localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. A further arrangement, to which an embodiment of the invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 may be used in such a system; however, sealing features are not present, are not activated, are not as efficient as normal or are otherwise ineffective to seal liquid to only the localized area. Four different types of localized liquid supply systems are illustrated in FIGS. 2-5.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate, desirably along the direction of movement of the substrate relative to the final element, and is removed by at least one outlet after having passed under the projection system. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. The arrows above the substrate W illustrate the direction of liquid flow, and the arrow below the substrate W illustrates the direction of movement of the substrate table. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and outlets can be arranged in a plate with a hole in substantially its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). In the cross-sectional view of FIG. 4, arrows illustrate the direction of liquid flow in inlets and out of outlets.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. In an embodiment, the apparatus has only one table. In an embodiment of a dual stage lithographic apparatus, the apparatus has a support table which is a substrate table WT and a support table which is unable to support a substrate but is a measurement table supporting one or more sensors. The measurement table may support one or more cleaning devices. Between, for example, exposure of successive substrates and/or during substrate swap on the substrate table, measurements may be carried out on the projection beam using at least one sensor on the measurement table.

Figure 5:
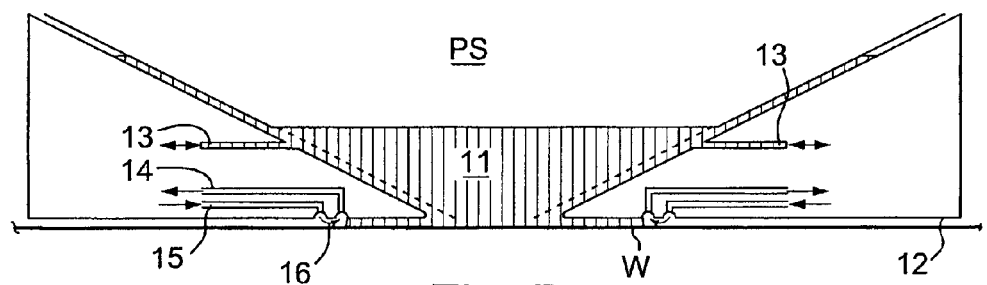
FIG. 5 depicts a further liquid supply system for use in a lithographic projection apparatus.

Another arrangement which has been proposed is to provide the liquid supply system with a fluid confinement structure. The fluid confinement structure may extend along at least a part of a boundary of the space between the final element of the projection system and the substrate table. Such an arrangement is illustrated in FIG. 5. The fluid confinement structure is substantially stationary relative to the projection system in the XY plane though there may be some relative movement in the Z direction (in the direction of the optical axis). A seal is formed between the fluid confinement structure and the surface of the substrate, or the substrate table, or both. (Please note that reference in the following text to surface of the substrate W also refers in addition or in the alternative to a surface of a support table such as the substrate table WT or measurement table, unless expressly stated otherwise.) In an embodiment, a seal is formed between the fluid confinement structure and the surface of the substrate and may be a contactless seal such as a gas seal. Such a system is disclosed in United States patent application publication no. US 2004-0207824. In an embodiment, the fluid confinement structure is used to confine liquid, and so may be referred to as a liquid confinement structure.

FIG. 5 schematically depicts a localized liquid supply system such as with a fluid handling structure or a device with a body 12 forming a fluid confinement structure, which extends along at least a part of a boundary of the space 11. The space may be formed between the final element of the projection system PS and a surface of the substrate table WT, substrate W or both. The fluid handling structure is substantially stationary relative to the projection system PS in the XY plane though there may be some relative movement in the Z direction (in the direction of the optical axis). In an embodiment, a seal is formed between the body 12 and the surface of the substrate W and/or substrate table WT and may be a contactless seal such as a gas seal or other fluid seal.

The fluid handling device at least partly contains liquid in the space 11 between a final element of the projection system PS and the substrate W. A contactless seal, such as a gas seal 16, to the substrate W may be formed around the image field of the projection system PS so that liquid is confined within the space 11. The space 11 is at least partly formed by the body 12 positioned below and surrounding the final element of the projection system PS. Liquid is brought into the space 11 below the projection system PS and within the body 12 by liquid inlet 13. The liquid may be removed by liquid outlet 13. The body 12 may extend a little above the final element of the projection system PS. The liquid level rises above the final element so that a buffer of liquid is provided. In an embodiment, the body 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case. The inner periphery may be any shape, for example the inner periphery may conform to the shape of the final element of the projection system. The inner periphery may be round.

The liquid is contained in the space 11 by the gas seal 16 which, during use, is formed between the bottom of the body 12 and the surface of the substrate W. The gas seal 16 is formed by gas, e.g. air or synthetic air but, in an embodiment, $N_2$ or another inert gas. The gas in the gas seal 16 is provided under pressure via inlet 15 to the gap between body 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the body 12 and the substrate W contains the liquid in a space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824 which is hereby incorporated by reference in its entirety.

The example of FIG. 5 is a so called localized area arrangement in which liquid is only provided to a localized area of the top surface of the substrate W at any one time. Other arrangements are possible, including fluid handling systems which make use of a single phase extractor or a two phase extractor as disclosed, for example, in United States patent application publication no US 2006-0038968 which is hereby incorporated by reference in its entirety. In an embodiment, a single or two phase extractor may comprise an inlet which is covered by a porous material. In an embodiment of a single phase extractor the porous material is used to separate liquid from gas to enable single-liquid phase liquid extraction. A chamber downstream of the porous material is maintained at a slight under pressure and is filled with liquid. The under pressure in the chamber is such that the meniscuses formed in the holes of the porous material prevent ambient gas from being drawn into the chamber. However, when the porous surface comes into contact with liquid there is no meniscus to restrict flow and the liquid can flow freely into the chamber. The porous material has a large number of small holes, e.g. of diameter in the range of 5 to 300 µm, desirably 5 to 5 µm. In an embodiment, the porous material is at least slightly lyophilic (e.g., hydrophilic), i.e. having a contact angle of less than 90° to the immersion liquid, e.g. water.

Many other types of liquid supply system are possible. For example liquid may be extracted in a two-phase flow through openings in a surface of the fluid handling structure 12. The liquid in the space 11 may form a meniscus 170 between the surface of the fluid handling structure 12 and a facing surface which may be a surface of the substrate W, the substrate table WT or both. The openings may serve in use to pin the meniscus 170. An embodiment of the present invention may be advantageous for use with a confined immersion system in which the liquid between the final element of the projection system PS and the substrate W is confined, for example, in optimizing the use. However, an embodiment of the present invention can be used with, and is not limited to, any particular type of liquid supply system.

When liquid is supplied by the fluid handling structure system, a surface 100 under the fluid handling structure 12 is present. The surface 100 may during use face the fluid handling structure 12 and so may be referred to as a facing surface 100. Liquid is provided to a localized area of the facing surface 100 by the fluid handling structure 12. An edge of the localized area is defined by the liquid meniscus 170. During use the surface 100 moves relative to the fluid handling structure 12. In order to confine (or contain) liquid in the space 11 to the localized area, the meniscus 170 should be stable.

Difficulties can arise if the surface 100 of the localized area comprises, in cross-section, a feature such as an edge 150 of a structural feature, for example a change in distance between the surface of the fluid handling structure 12 and the facing surface 100. The change in distance may be gradual or discontinuous and may be referred to as a step. At the step there is a difference in height in the surface 100 (so that the step may be referred to as a height step). The step may have a discontinuous change in surface height. The meniscus 170 can be pinned at the step. The pinning of the meniscus 170 leads to stretching/pulling of the meniscus 170 as the facing surface 100 moves further relative to the fluid handling structure 12. Eventually, the liquid meniscus 170 will break possibly leading to a droplet or several droplets being left behind on the facing surface 100 (or other surface of the lithographic apparatus) and/or in the corner of the edge 150 or a bubble inclusion in the liquid confined by the fluid handling structure 12.

A droplet may lead to localized evaporational cooling, for example on the surface on which the droplet is located. Such cooling may lead to thermal distortion, e.g., expansion/contraction, effects. The liquid of the droplet may contain a solute and/or particulate material. Evaporation of the droplet may lead to a drying stain to form. In addition or alternatively, a collision of a droplet with the meniscus 170 may itself result in a bubble inclusion, such as a sticking bubble (i.e., a bubble that sticks to a surface in contact with the liquid) or a floating bubble (i.e. a bubble suspended in liquid), in immersion liquid confined in the fluid handling structure 12. A bubble in the liquid of the fluid handling structure 12 may result in an imaging defect.

Figure 6:
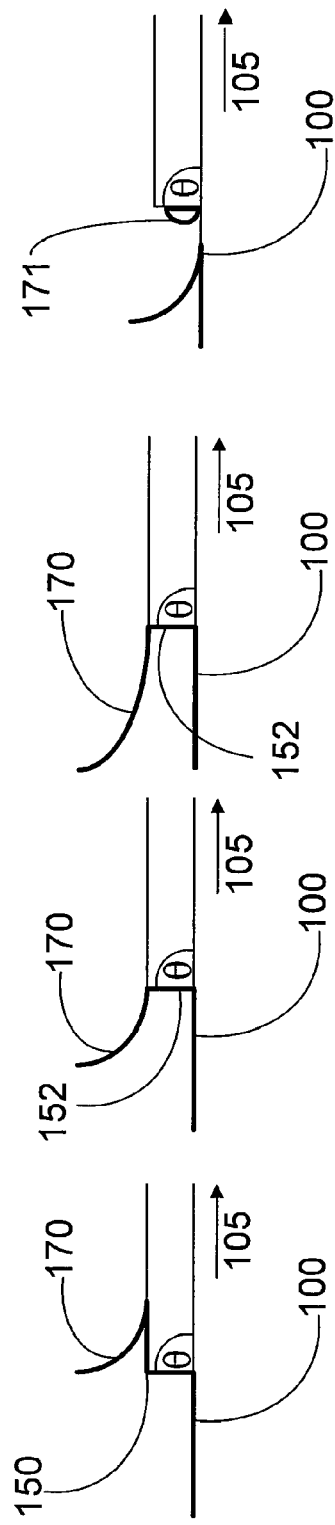

FIG. 6 shows, in cross-section, a surface 100 with a feature comprising in cross-section, an edge 150 of, for example, a step. Arrow 105 illustrates the direction of movement of the surface 100 relative to a fluid handling structure 12 (not illustrated). In an embodiment, the fluid handling structure 12 is stationary. Relative to the fluid handling structure 12, the surface 100 is a facing surface. A meniscus 170 extends between the facing surface 100 and the fluid handling structure 12. FIG. 6 shows the relative positions of the meniscus 170 and the surface 100 during relative movement in direction 105 between the surface 100 and the meniscus 170, for example as the surface 100 is moved. In the case shown in FIG. 6, the relative movement of the meniscus 170 is between a higher portion of the surface 100 on one side of edge 150 to a lower portion on the other side of edge 150. The part of the meniscus 170 at the surface 100 moves downwardly over the step.

As the meniscus 170 moves (e.g. runs) over the edge 150, the meniscus 170 can be pinned at the edge 150 in the position illustrated in the center left and center right pictures of FIG. 6. In the center right picture of FIG. 6 the meniscus 170 is being stretched. In the far right-hand side picture of FIG. 6 the situation after the meniscus has been stretched and de-pinned from the edge 150 is illustrated. As can be seen, a droplet 171 is formed as an end of the receding/trailing meniscus 170 moves down the step.

Figure 7:
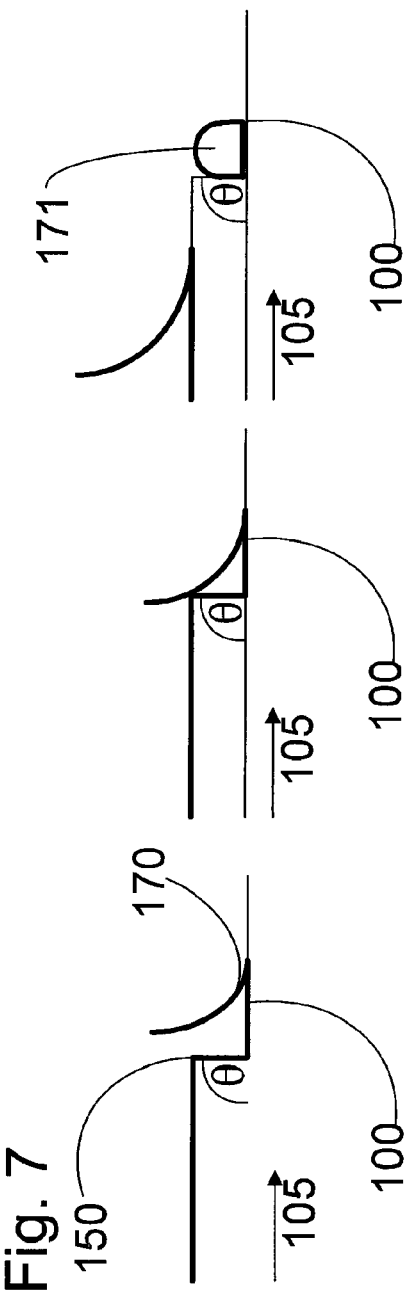

FIG. 7 shows the situation similar to FIG. 6 except that in the relative motion between the meniscus 170 and the surface 100, the meniscus 170 is moving over the edge 150 of the step in the opposite direction. As shown in FIG. 7, the meniscus 170 moves from a lower portion on one side of edge 150 to a higher portion on the other side of edge 150. The meniscus 170 travels up the step relative to the surface 100. Here the meniscus is pinned in the central picture of FIG. 7 to the edge 150. In the right-hand picture the meniscus 170 has been de-pinned but a droplet 171 remains. The droplet 171 has been left behind on a lower portion of the surface 100 below the step.

In an embodiment, the surface tension of liquid at the meniscus 170 when it is at the pinning position (i.e. at the feature or edge 150) is lowered. Lowering the surface tension of the liquid meniscus at the pinning position results in a local weakening of the film close to the pinning location and the meniscus 170. As a result, the meniscus 170 is de-pinned and can move on, for example on the surface 100. In this way liquid loss as illustrated in FIGS. 6 and 7 may be avoided.

Additionally or alternatively, locally lowering the surface tension of liquid at the meniscus 170 may avoid bubble inclusion. The mechanism for bubble inclusion is illustrated in FIGS. 8 and 9. In FIG. 8 a bubble 172 is formed when a gas space 173 is included at the edge 150 as the advancing/ leading meniscus 170 moves up the edge 150. In the embodiment depicted in FIG. 8, a bubble 172 is included as the meniscus 170, e.g. an advancing meniscus, moves from a lower portion on one side of edge 150 to a higher portion on the other side of edge 150. When the meniscus 170 is on the lower portion of the surface 100 and the edge 150 approaches the meniscus, a contact part 174 of the meniscus 170 above the surface 100 may meet the edge 150. The part of the meniscus 170 pins to the edge 150, including the gas space 173 between the surface 100 and the meniscus 170 between the contact part 174 and the lower portion of the surface 100. Relative movement between the meniscus 170 and the surface 100 continues above the contact part 174 over the higher portion. The bubble 172 forms from the gas included in the gas space 173.

In the example of FIG. 9, the gas space 173 is included into liquid in the space 11 as the meniscus 170 moves downwards over the edge 150. In the embodiment shown in FIG. 9 the gas space 173 forms as the meniscus 170 moves from a higher portion on one side of edge 150 to a lower portion on the other side of edge 150 to result in a bubble 172. The mechanism is similar to that of the arrangement shown in FIG. 8; except the meniscus 170 is pinned to the edge 150, stretched and a contact part 174 of the meniscus 170 contacts the lower portion of the surface 100 to include the bubble 172. The bubble 172 may be considered to form under a step.

In an embodiment an adjustment fluid source is provided. The adjustment fluid may be, for example, a liquid such as a solvent, e.g. an organic liquid. The adjustment fluid source (or solvent source) is configured locally to change the composition of immersion liquid. In particular, the adjustment fluid source changes the composition of immersion liquid at the meniscus 170, for example the liquid in the region of the meniscus 170 near the edge 150. This causes a local decrease in surface tension in the meniscus 170 as it moves over the edge 150. The induced local decrease in surface tension results in local weakening of the film close to the pinning location. The meniscus 170 can then retract. The quantity of the adjustment fluid supplied from the adjustment fluid source is desirably small enough that the optical properties of the immersion liquid would not be adversely affected by the presence of the adjustment fluid. In an embodiment it is desirable that the supply of the adjustment fluid is provided at a location so that it may be readily removed from the liquid before becoming dispersed in the immersion liquid in the space 11.

The application of the extra "force" to the meniscus by application of the adjustment fluid can cause the contact line of the meniscus 170 to contract. The surface tension in a meniscus decreases, enabling the bulk liquid to pull the liquid away from the edge 150 and to effect de-pinning.

Any solvent surfactant which is soluble in immersion liquid and reduces the surface tension of the immersion liquid could be used. For example, an organic compound such as an alcohol could be used. In an embodiment, the adjustment fluid may be isopropanol (IPA) for example, if the immersion liquid is water. If a layer of isopropanol of 10 µm thick under the member 200 (see FIG. 10 and subsequent discussion) is used, isopropanol should be present in the immersion liquid at a concentration of about 10 nanograms IPA/L, given a flow under the projection system PS of about 1 liter/m. Such a concentration should not impose a large risk of imaging defectivity. In another arrangement, the calculation may give different, but perhaps a more realistic estimate of the parameters of the fluid flow. If a layer of isopropanol of 1 µm thick under the member 200 (see FIG. 10 and subsequent discussion) is used, isopropanol should be present in the immersion liquid at a concentration of about 10 milligrams IPA/L, given a flow under the projection system PS of about 2.5 liters/m. In this arrangement, such a concentration of IPA should not impose a large risk of imaging defectivity.

It is desirable if the angle the side 152 of the edge 150 makes to the surface 100 is 30° or less (as measured by angle θ in FIG. 6). Therefore in one embodiment the angle which the side 152 of the edge 150 makes with the surface 100 is less than 30°, desirably less than 20°. If the angle of the side 152 of the edge 50 is less than 30° to the surface 100 and the coating on the top surface is lyophobic, theoretically pinning can be avoided up to a critical velocity. However, in practice it is usually not possible to manufacture such a perfect edge. At the thinnest part of the edge it is likely that a part with a thickness of several microns with a slope of 70° to 90° may be present. The meniscus 170 could be pinned at this location. However, providing an adjustment fluid source in this case may be particularly effective because the distance from an adjustment fluid source to the position of pinning will be smaller than if the whole of the side 152 of the edge 150 is at 90° to the surface 100.

Figure 10:
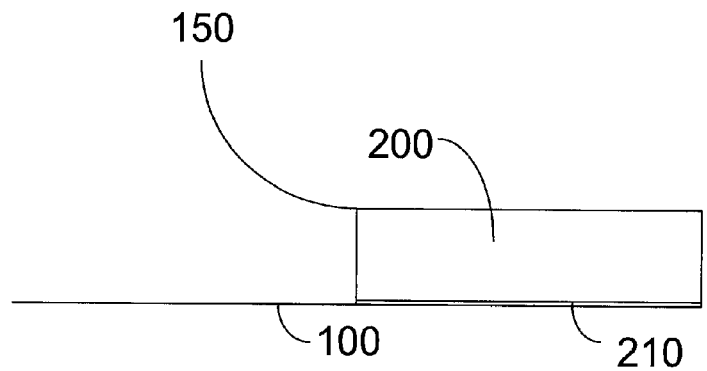

In an embodiment illustrated in FIG. 10, an edge 150 is formed on a surface 100 due to the presence of a further component or member 200 on the surface 100. The member 200 could, for example, be planar member attached to the surface 100. The planar member may be adhered to at least a part of the surface 100 (and for that reason may be referred to as a 'sticker'). The planar member may be a bridge (e.g. to, bridge a gap between components) as will be described herein with reference to FIGS. 11 and 12. In an embodiment the member 200 may additionally or alternatively provide a surface property to the covered portion of the surface 100 such as a contact angle with respect to the immersion liquid.

The adjustment fluid source 210 may be provided between the member 200 and the surface 100. If the adjustment fluid is in the form of a liquid, capillary forces between the member 200 and the surface 100 help to keep the adjustment fluid 210 between the member 200 and surface 100. When the meniscus 170 passes over the edge 150 the surface tension of liquid at the meniscus 170 is locally decreased because it is in contact with the adjustment fluid of the adjustment fluid source 210. De-pinning of the meniscus 170 to the edge 150 thereby occurs.

In an embodiment the adjustment fluid source 210 may be a solid adjustment fluid source (as long as the rate of solubility is high enough). The solid adjustment fluid source is soluble enough to dissolve in the immersion liquid and thereby to change the surface tension and induce the desired effect.

In an embodiment the member 200 may itself be the adjustment fluid source or may be integrally formed with the adjustment fluid source. For example, the member 200 may have a top surface which may be lyophobic. The member 200 may include a layer underneath the top lyophobic surface which is an adjustment fluid source 210 that may be adhered to the surface 100. The adjustment fluid source 210 may be under the top layer. The adjustment fluid source 210 may be in the layer formed as an underneath layer. The adjustment fluid source, for example as the underneath layer, may be adhered to the surface of the 100. The adjustment fluid source 210 may be a porous material impregnated with adjustment fluid.

Figure 11:
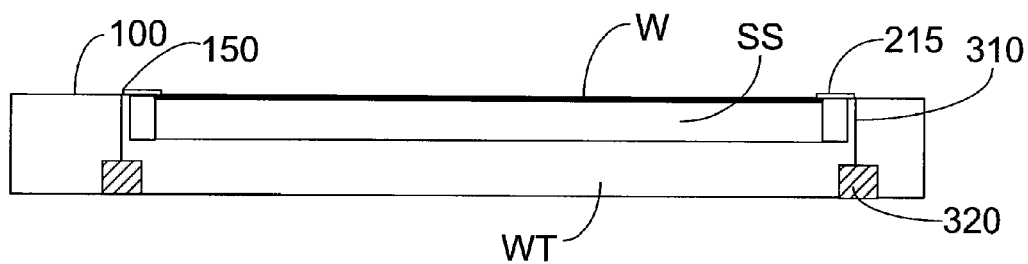
FIG. 11 depicts, in cross-section, an embodiment of a substrate table including a surface tension adjustment fluid source.

FIG. 11 illustrates, in cross-section, a further embodiment. In the embodiment of FIG. 11 an edge 150 in the form of a step is present on the surface 100. The surface 100 is a top surface of a substrate table WT. The substrate table WT may comprise a short stroke module for fine motion. The substrate table WT supports a substrate support SS which itself supports a substrate W. The short stroke module is itself carried by a long stroke module (not illustrated). The long stroke module is used for coarse positioning of the substrate W and the short stroke module moves relative to the long stroke module for fine positioning of the substrate W. The substrate support SS may, for example, be a so-called pimple-table.

In FIG. 11 a (moveable) planar member 215 is illustrated. The planar member 215 functions as a seal to bridge a gap between the edge of the substrate W and an edge of the substrate table WT when the substrate W is on the substrate support SS. Such a planar member 215 may be termed a substrate edge seal 215. In an embodiment the substrate edge seal 215 forms a ring (and may be a ring) when sealing the gap. In use, an inner edge of the substrate edge seal 215 is placed at or over the outer edge of the substrate W. The outer edge of the substrate edge seal 215 is placed at or on the top surface 100 of the substrate table WT.

As illustrated in FIG. 11 the substrate edge seal 215 is placed, for an example by a positioning module in the substrate table WT, over an edge of a recess in a substrate table WT in which the substrate support SS and substrate W are placed. Any gap, such as a substrate edge gap between the top surface of substrate W and the top surface of the substrate table WT is covered by the substrate edge seal 215. The substrate edge seal 215 helps prevent liquid finding its way into the substrate edge gap between the substrate W and the substrate table WT, for example between an edge of the substrate table WT surrounding at least part of the periphery of the substrate support SS and a substrate W when present on the substrate support SS. For example, when the edge of the substrate W is being imaged and liquid is being provided by the fluid handling structure 12 over the substrate edge gap, the substrate edge seal 215 helps prevent liquid ingress into the substrate edge gap. The substrate edge seal 215 is removable before substrate W swap and replaceable after substrate W swap over the edge of the new substrate W on the substrate support SS as described in U.S. patent application no. U.S. 61/213,658, filed on 30 Jun. 2009. The substrate edge seal 215, for example, is connected to an actuator within the substrate table WT. The actuator raises the substrate edge seal 215 radially away from the substrate W edge.

The substrate edge seal 215 has an edge 150 which forms a step 150 relative to the surface 100 over which the meniscus 170 will pass during certain movements of the substrate table WT.

In the embodiment of FIG. 11, an adjustment fluid source is provided in the form of an opening in an end of a capillary channel 310. The capillary channel 310 extends from an end of the channel 310 with a supply opening to a second, e.g. opposite, end by which the channel 310 is in fluid communication with a chamber 320 of adjustment fluid. The supply opening is formed at least in part in or near the substrate edge seal 215. The supply opening may be adjacent to the edge 150 such that when the meniscus 170 passes over the edge 150 adjustment fluid dissolves into the liquid, desirably locally to the edge 150. The adjustment fluid thereby helps to reduce the surface tension of the meniscus 170 and may help prevent pinning at the edge 150.

In order to prevent or reduce sloshing of fluid in the chamber 320, the chamber 320 may have a porous media to hold the adjustment fluid. Alternatively or additionally, a pump with a piston that pushes the liquid (so that there is no free surface) could be used. Desirably the capillary pressure in the capillary channel 310 is higher than pressure peaks in the adjustment fluid in the chamber 320 due to the acceleration of the substrate table WT. If this is achieved (by choice of the diameter of the capillary channel 310 and the adjustment fluid), spilling of adjustment fluid on a surface, e.g., a top surface, of the substrate table WT can be avoided.

Figure 12:
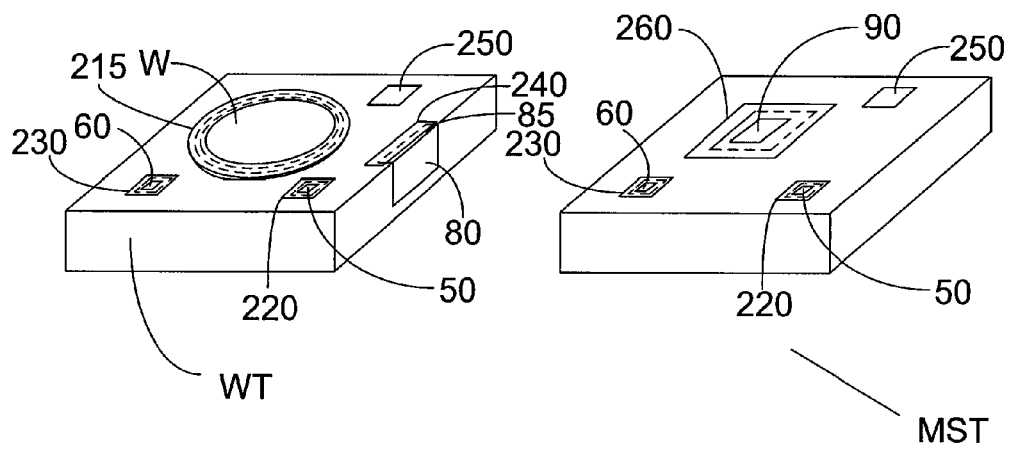
FIG. 12 depicts a substrate table and a measurement table.

In an immersion lithographic apparatus there are many positions at which an edge 150 (e.g., due to an adhereable planar member such as a sticker) may be present on a surface, such as a top surface, to which liquid is provided by the fluid handling structure 12. Many of these positions are illustrated in FIG. 12 but these should be regarded as examples only and are non-limiting. In all cases, the meniscus 170 is in danger of being pinned by the edge 150 of a member (such as a planar member such as an adhered sticker), which may lead to liquid loss. An embodiment of the invention can be applied to all or some of a plurality of edges 150.

A substrate table WT supports a substrate W. In FIG. 12 the substrate table WT illustrated has a substrate support SS (not shown) with a substrate edge seal 215 bridging the gap between the substrate W and/or substrate support SS and the substrate table WT. Illustrated in FIG. 12 are a sensor 50 and a sticker 220 covering the gap between the sensor 50 and the substrate table WT. Additionally or alternatively, a sensor target 60 may be a separate member mounted in a recess in a substrate table WT. A sticker 230 may bridge the gap between the sensor target 60 and the substrate table WT.

A bridge 80 is illustrated. The bridge 80 may be retractable. During swapping of tables under the projection system, for example swap of a substrate table WT for a measurement table MST, it is desirable to maintain liquid in contact with the final element or projection system PS to avoid drying stains. This is achieved by providing a surface to be positioned under the fluid handling structure 12 at all times. A bridge 80 can be provided to bridge the gap between the two tables, for example between the substrate table WT and the measurement table MST illustrated in FIG. 12. The bridge 80 may have a bridge head 85 to attach the bridge 80 to the substrate table WT and optionally housing the mechanism for deploying and retracting the bridge 80 at appropriate times. A gap may be present between the bridge head 85 and the substrate table WT and this may be bridged by a planar member such as a sticker 240. Although the bridge 80 and the bridge head 85 are shown on the substrate table WT, one or more of them may be located on the other table, such as a measurement table MST.

The measurement table MST is used in a dual stage design where one or more sensors are one of the two tables and the substrate W is support by the other. The measurement table MST is provided for taking measurements and may be used as a surface to block the liquid in the fluid handling structure 12 during, e.g., swapping of substrates W on the substrate table WT. For this purpose a top surface 100 is provided: In an embodiment, the top surface 100 is lyophobic to the immersion liquid. For this purpose an adhered planar member, e.g. sticker, 250 may be provided on the top surface 100. The sticker 250 has a lyophobic top surface itself. The sticker 250 may make the surface 100 lyophobic or may reinstate a lyophobic property to the top surface 100 after the lyophobic property of the top surface 100 has degraded, for example, during use. Such a sticker 250 may also or alternatively be present on the substrate table WT, as illustrated.

The measurement table MST may comprise a sensor 50 and sticker 220 similar to that on the substrate table WT. A sensor target 60 and associated sticker 230 may be provided also or in the alternative. The sensor target 60 and sensor 50 provided on the measurement table MST may be same or different to those provided on a substrate table WT. In addition, an optional cleaning station 90 is illustrated as being provided on the measurement table MST. The cleaning station 90 may be a cleaning station to clean the liquid handling system and/or the final element of the projection system PS. A sticker 260 may be provided to bridge a gap between the cleaning station 90 and the measurement table MST.

An embodiment of the present invention may be applied to any or all of the edges made by members/stickers 210, 220, 230, 240, 250 and 260 illustrated in FIG. 12.

An embodiment of the present invention is advantageous in that it reduces the chance of liquid loss and/or bubble inclusion. Therefore a possible advantage is lower defectivity. Additionally or alternatively, higher throughput may be possible because the tables WT, MST can be moved at greater speed relative to the fluid handling structure 12 because the chance of the meniscus 170 pinning at features is decreased.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

One or more controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure), or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

In an embodiment, there is provided an immersion lithographic apparatus comprising: a fluid handling system configured to provide immersion liquid between a final element of a projection system and a surface which comprises, in cross-section, a feature; and an adjustment fluid source configured locally to change the composition of the immersion liquid to cause a local decrease in surface tension of the immersion liquid at least when a meniscus of the immersion liquid contacts the feature.

In an embodiment, the adjustment fluid source is positioned on the surface adjacent to the feature. In an embodiment, the source comprises a solid adjustment fluid source. In an embodiment, the adjustment fluid source comprises an opening in one end of a capillary channel, the capillary channel being at the other end in fluid communication with a chamber of adjustment fluid. In an embodiment, the surface includes a surface of a table. In an embodiment, the table is a substrate table or a measurement table. In an embodiment, the feature is an edge between at least two adjacent parts of the surface. In an embodiment, the edge is a height step in the surface. In an embodiment, the feature is an edge of a planar member on the surface. In an embodiment, the planar member has a surface property different to the surface on which the planar member is located. In an embodiment, the planar member is adhered to the surface. In an embodiment; the planar member bridges a gap between a first object and a second object. In an embodiment, the first object is at least one selected from the following: a sensor, a cleaning station, a substrate support, a sensor target, a bridge head, or a bridge. In an embodiment, the second object is a table. In an embodiment, the second object is a substrate support located within a substrate table. In an embodiment, the first object is a bridge head and the second object is a bridge. In an embodiment, the planar member is a substrate edge seal, and the first object is a table. In an embodiment, the second object is a substrate. In an embodiment, the fluid handling system is configured to supply and confine immersion liquid to a space between a final optical element and a facing surface of a substrate, or a table, or both. In an embodiment, the fluid handling system is a localized fluid handling system configured to provide liquid to only a localized area of a top surface of a substrate, and/or a table. In an embodiment, the feature is an edge which is formed by a member on the surface and the adjustment fluid source is positioned between the member and the surface. In an embodiment, the adjustment fluid source is a liquid and is held between the member and the surface by capillary force. In an embodiment, the member is adhereable.

In an embodiment, there is provided a device manufacturing method, comprising: projecting a patterned beam of radiation through an immersion liquid confined to a space between the final element of a projection system and the substrate by a fluid handling system; moving a surface comprising, in cross-section, a feature; and locally changing the composition of immersion liquid as a meniscus of immersion liquid moves over the feature.

In an embodiment, there is provided a support table having a surface comprising in cross-section a feature, the support table comprising: a surface tension adjustment fluid source configured to supply fluid, the surface tension adjustment fluid source being in fluid communication with the surface so that when an immersion liquid meniscus moves over the feature the surface tension adjustment fluid from the source changes the composition of the immersion liquid locally to the feature causing a local decrease in surface tension of the meniscus.

In an embodiment, there is provided an immersion lithographic apparatus comprising: a fluid handling structure configured to supply immersion liquid to a space between a final element of a projection system and a surface of a body which moves relative to the projection system, the surface comprising a feature; and a surface tension adjustment fluid source configured to change the composition of immersion liquid locally to the feature by adjusting the surface tension of a liquid meniscus between the fluid handling structure and the surface as the meniscus moves relatively across the surface.

The descriptions above are intended to be illustrative, not limiting. Thus, it will be apparent to one skilled in the art that modifications may be made to the invention as described without departing from the scope of the claims set out below.

The invention claimed is:

1. An immersion lithographic apparatus comprising:
a fluid handling system configured to provide immersion liquid between a final element of a projection system and a surface which comprises, in cross-section, a feature; and
an adjustment fluid source configured locally to change the composition of the immersion liquid to cause a local decrease in surface tension of the immersion liquid at least when a meniscus of the immersion liquid contacts the feature.

2. The immersion lithographic apparatus of claim 1, wherein the adjustment fluid source is positioned on the surface adjacent to the feature.

3. The immersion lithographic apparatus of claim 1, wherein the source comprises a solid adjustment fluid source.

4. The immersion lithographic apparatus of claim 1, wherein the adjustment fluid source comprises an opening in one end of a capillary channel, the capillary channel being at the other end in fluid communication with a chamber of adjustment fluid.

5. The immersion lithographic apparatus of claim 1, wherein the surface includes a surface of a table.

6. The immersion lithographic apparatus of claim 1, wherein the feature is an edge between at least two adjacent parts of the surface.

7. The immersion lithographic apparatus of claim 1, wherein the feature is an edge of a planar member on the surface.

8. The immersion lithographic apparatus of claim 7, wherein the planar member has a surface property different to the surface on which the planar member is located.

9. The immersion lithographic apparatus of claim 7, wherein the planar member is adhered to the surface.

10. The immersion lithographic apparatus of claim 7, wherein the planar member bridges a gap between a first object and a second object.

11. The immersion lithographic apparatus of claim 10, wherein the first object is at least one selected from the following: a sensor, a cleaning station, a substrate support, a sensor target, a bridge head, or a bridge.

12. The immersion lithographic apparatus of claim 10, wherein the first object is a bridge head and the second object is a bridge.

13. The immersion lithographic apparatus of claim 10, wherein the planar member is a substrate edge seal, and the first object is a table.

14. The immersion lithographic apparatus of claim 13, wherein the second object is a substrate.

15. The immersion lithographic apparatus of claim 1, wherein the fluid handling system is configured to supply and confine immersion liquid to a space between a final optical element and a facing surface of a substrate, or a table, or both.

16. The immersion lithographic apparatus of claim 1, wherein the feature is an edge which is formed by a member on the surface and the adjustment fluid source is positioned between the member and the surface.

17. The immersion lithographic apparatus of claim 16, wherein the member is adhereable.

18. A device manufacturing method, comprising:
projecting a patterned beam of radiation through an immersion liquid confined to a space between the final element of a projection system and the substrate by a fluid handling system;
moving a surface comprising, in cross-section, a feature; and
locally changing the composition of immersion liquid as a meniscus of immersion liquid moves over the feature.

19. A support table having a surface comprising in cross-section a feature, the support table comprising:
a surface tension adjustment fluid source configured to supply fluid, the surface tension adjustment fluid source being in fluid communication with the surface so that when an immersion liquid meniscus moves over the feature the surface tension adjustment fluid from the source changes the composition of the immersion liquid locally to the feature causing a local decrease in surface tension of the meniscus.

20. An immersion lithographic apparatus comprising:
a fluid handling structure configured to supply immersion liquid to a space between a final element of a projection system and a surface of a body which moves relative to the projection system, the surface comprising a feature; and a surface tension adjustment fluid source configured to change the composition of immersion liquid locally to the feature by adjusting the surface tension of a liquid meniscus between the fluid handling structure and the surface as the meniscus moves relatively across the surface.

* * * * *